United States Patent
Earl et al.

(10) Patent No.: US 10,129,960 B2
(45) Date of Patent: Nov. 13, 2018

(54) ANTENNA ARRANGEMENT FOR A SOLID-STATE LAMP

(71) Applicant: Cree, Inc., Durham, NC (US)

(72) Inventors: Paul Earl, Apex, NC (US); Matthew C. Reynolds, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 183 days.

(21) Appl. No.: 14/537,005

(22) Filed: Nov. 10, 2014

(65) Prior Publication Data
US 2016/0135270 A1 May 12, 2016

(51) Int. Cl.
| | | |
|---|---|---|
| H05B 37/02 | (2006.01) | |
| H05K 3/36 | (2006.01) | |
| F21V 23/04 | (2006.01) | |
| F21K 9/232 | (2016.01) | |
| F21K 9/238 | (2016.01) | |
| H05B 33/08 | (2006.01) | |
| F21Y 115/10 | (2016.01) | |
| F21Y 107/90 | (2016.01) | |

(52) U.S. Cl.
CPC ......... *H05B 37/0272* (2013.01); *F21K 9/232* (2016.08); *F21K 9/238* (2016.08); *F21V 23/0435* (2013.01); *H05B 33/0803* (2013.01); *H05K 3/366* (2013.01); *F21Y 2107/90* (2016.08); *F21Y 2115/10* (2016.08)

(58) Field of Classification Search
CPC ............ H05B 37/0272; H05B 33/0803; H05K 3/366; F21K 9/238; F21K 9/232; F21V 23/0435; F21Y 2107/90; F21Y 2115/10
USPC ..................... 315/34, 39, 112, 113
See application file for complete search history.

(56) References Cited

U.S. PATENT DOCUMENTS

| | | | | |
|---|---|---|---|---|
| 6,107,755 | A * | 8/2000 | Katyl | H05B 41/3921 315/224 |
| 6,867,554 | B2 * | 3/2005 | Ribarich | H05B 41/02 315/291 |
| 7,965,023 | B1 | 6/2011 | Liang | |
| 8,278,835 | B1 * | 10/2012 | Radzinski | H05B 41/295 315/246 |
| 8,282,249 | B2 | 10/2012 | Liang et al. | |

(Continued)

OTHER PUBLICATIONS

U.S. Appl. No. 61/977,263, filed Apr. 9, 2014.

*Primary Examiner* — Tung X Le
*Assistant Examiner* — Borna Alaeddini
(74) *Attorney, Agent, or Firm* — Dennis J. Williamson; Moore & Van Allen PLLC

(57) ABSTRACT

An antenna arrangement for a solid-state lamp is disclosed. Embodiments of the invention provide for improved performance by positioning the antenna for radio frequency (RF) control of the lamp non-parallel to the main driver board and/or the LED board. This positioning can provide distance from the main board circuitry and a ground plane for the antenna. An RF daughter card can be used for the antenna and also possibly for other RF components. In some embodiments, the antenna is substantially perpendicular to the main board. In some embodiments, the lamp is dimensioned as a replacement for a standard incandescent bulb, such as an A, BR, or PAR bulb. In some embodiments, an optically transmissive enclosure and/or a base define the interior cavity of the lamp. A plurality of LEDs can be disposed within the optically transmissive enclosure.

17 Claims, 8 Drawing Sheets

(56) References Cited

U.S. PATENT DOCUMENTS

| | | | |
|---|---|---|---|
| 8,421,329 B2 | 4/2013 | Liang et al. | |
| 8,427,037 B2 | 4/2013 | Liang et al. | |
| 8,440,899 B1* | 5/2013 | Bowser | H05B 37/0254 84/609 |
| 8,556,465 B2 | 10/2013 | Lee et al. | |
| 8,658,877 B1* | 2/2014 | Bowser | H05B 37/0254 84/609 |
| 8,744,871 B1* | 6/2014 | Cienfuegos | H05B 33/086 235/385 |
| 2002/0130985 A1* | 9/2002 | Weindorf | G02B 6/0068 349/61 |
| 2003/0107331 A1* | 6/2003 | Ribarich | H05B 41/02 315/292 |
| 2006/0071864 A1* | 4/2006 | Richard | H01Q 1/242 343/702 |
| 2011/0156583 A1* | 6/2011 | Chuang | F21V 3/00 315/32 |
| 2011/0215724 A1* | 9/2011 | Chakravarty | H05B 37/02 315/152 |
| 2011/0316758 A1* | 12/2011 | Sumi | H01Q 1/243 343/847 |
| 2012/0274208 A1* | 11/2012 | Chen | H01Q 1/44 315/34 |
| 2013/0020941 A1* | 1/2013 | Breidenassel | F21V 23/005 315/113 |
| 2013/0070636 A1* | 3/2013 | Farley | H04W 4/008 370/254 |
| 2013/0082608 A1* | 4/2013 | Balasubramanian | H05B 41/282 315/178 |
| 2013/0175940 A1* | 7/2013 | O'Neil | H05B 33/0845 315/224 |
| 2013/0301252 A1* | 11/2013 | Hussell | F21V 29/24 362/184 |
| 2015/0308628 A1* | 10/2015 | Athalye | F21K 9/135 362/650 |

\* cited by examiner

ANTENNA ARRANGEMENT FOR A SOLID-STATE LAMP

BACKGROUND

Light emitting diode (LED) lighting systems are becoming more prevalent as replacements for legacy lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver any color light, and generally contain no lead or mercury. A solid-state lighting system may take the form of a luminaire, lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs, which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an enclosure for the electronics and/or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A separate heatsink is also often needed to cool the LEDs and/or power supply in order to maintain appropriate operating temperature.

SUMMARY

Embodiments of the invention provide for improved performance and space utilization in a solid-state lamp by placing the antenna for radio frequency (RF) control of the lamp in an orientation that is not parallel to the main driver board and/or LED board, as opposed to parallel to the main board. This positioning can provide distance from the main board circuitry and also a ground plane for the antenna. A small RF daughter card can be used for the antenna, which otherwise might not radiate effectively, and also other RF components. Fastening the daughter card to the main board can increase the ground plane area and thus improve radiation efficiency of the antenna.

Embodiments of the invention can provide a lamp including a circuit board in an interior cavity of the lamp. The circuit board may be thought of as a "main board" relative to the board or module that includes an antenna according to example embodiments of the invention, but can include either an LED (or LEDs), one or more power supply components, or both. The antenna is fixed within the interior cavity to be non-parallel to the circuit board. In some embodiments, the antenna is substantially perpendicular to the circuit board.

In some embodiments, the lamp includes an RF daughter card, and the antenna is either on or in the RF daughter card. The antenna could be part of another device on the card, such as an RF chip. In some embodiments the main circuit board includes a conductor that acts as a counterpoise or ground plane to improve the efficiency of the antenna. The antenna can be fixed in place relative to the main board in some embodiments by soldering the RF daughter card to the main circuit board, which may also enhance the performance of the counterpoise for the antenna. In some embodiments, the lamp has an Edison base. In some embodiments, the lamp is dimensioned as a replacement for an A-series incandescent bulb. In some embodiments, the lamp is dimensioned as a replacement for a BR or PAR type incandescent bulb. In some embodiments, an optically transmissive enclosure and/or a base define the interior cavity of the lamp. A plurality of LEDs can be disposed within the optically transmissive enclosure and a power supply or driver can reside in the base.

In operation, a power supply in LED lamp according to example embodiments of the invention can be energized by an external power source. The power supply in the lamp can be made to selectively energize at least one LED in accordance with signals received through the non-parallel antenna. By selectively energizing, what is meant is not only to turn an LED on and off, but also alter its operating characteristics to change the character of the light output of one or more LEDs or of the lamp.

DETAILED DESCRIPTION

Figure 1:
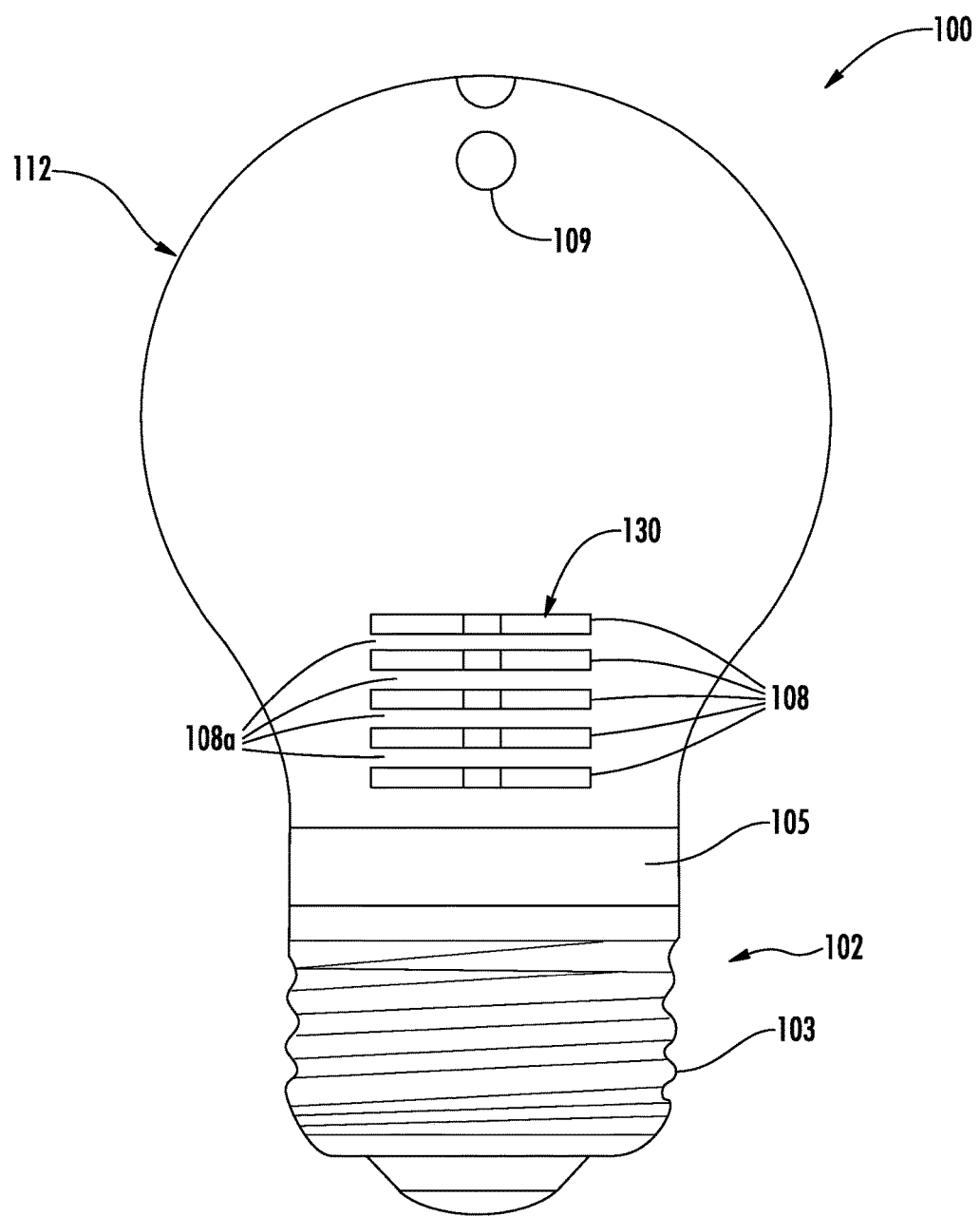
FIG. 1 is a side view of a solid-state lamp according to example embodiments of the invention.
Figure 2:
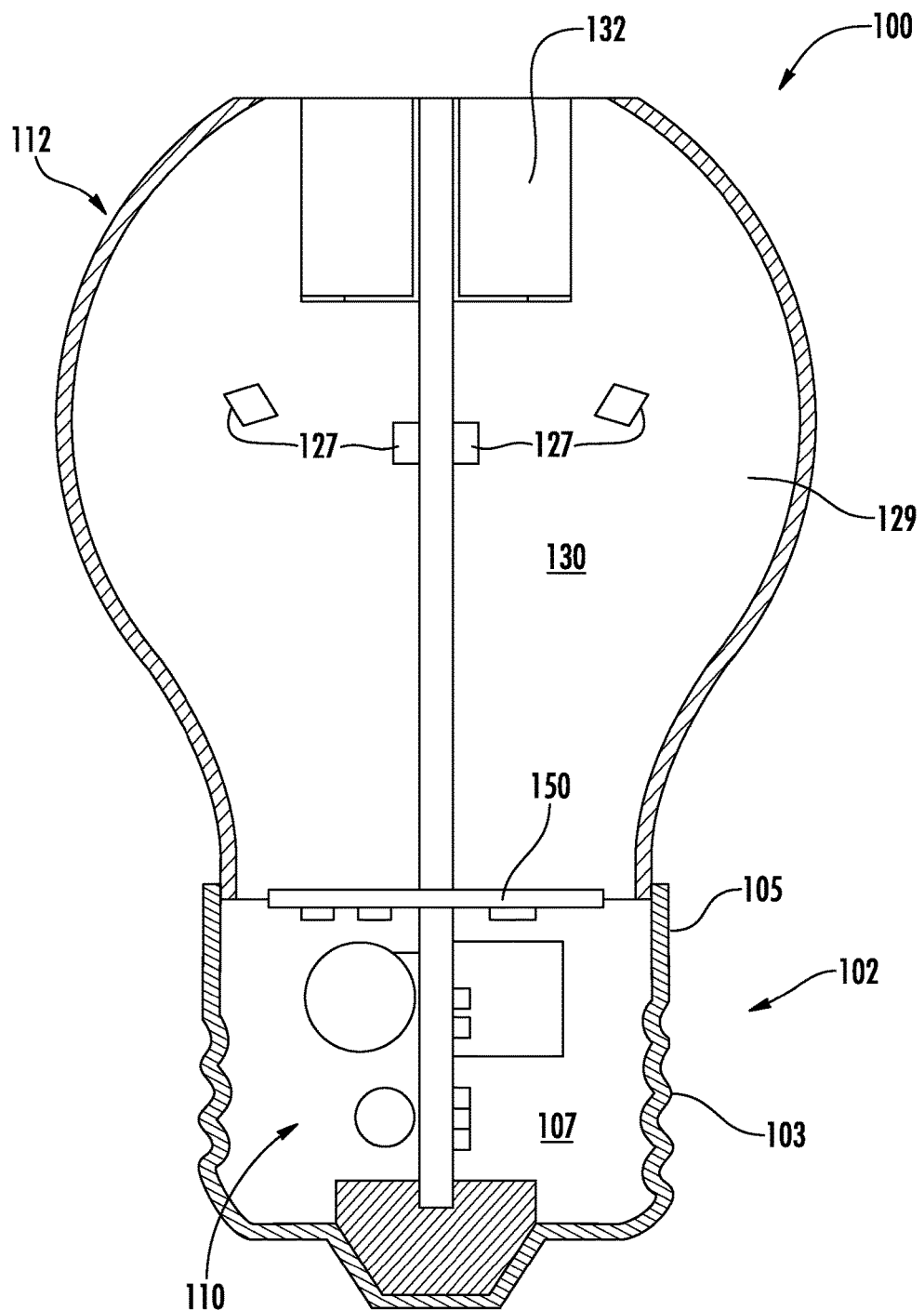
FIG. 2 is a cutaway view of the solid-state lamp of FIG. 1.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid-state light emitter" or "solid-state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid-state light emitters and/or multiple lumiphoric materials (i.e., in combination with at least one solid-state light emitter) may be used in a single device, such as to produce light perceived as white or near-white in character. In certain embodiments, the aggregated output of multiple solid-state light emitters and/or lumiphoric materials may generate warm white light output having a color temperature range of from about 2700K to about 4000K.

Solid-state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid-state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials may be associated with a lumiphor, a lumiphor binding medium, or a lumiphor support element that may be spatially segregated from a solid-state emitter.

It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture.

FIGS. 1, 2, 4, and 5 show a lamp, 100, according to some embodiments of the present invention in a form factor of a traditional incandescent bulb. In an omnidirectional lamp such as lamp 100 the light is emitted in a wide omnidirectional pattern. In one embodiment, the enclosure and base are dimensioned to be a replacement for an ANSI standard A series bulb such that the dimensions of the lamp 100 fall within the ANSI standards for an A series bulb. In one embodiment, the lamp 100 is configured to be a replacement for an ANSI standard A19 bulb such that the dimensions of the lamp 100 fall within the ANSI standards for an A19 bulb. The dimensions may be different for other ANSI standards including, but not limited to, A21 and A23 standards. In the lamp 100, light is emitted from the lamp in an omnidirectional pattern and in one embodiment the lamp may comply with "ENERGY STAR® Program Requirements for Integral LED Lamps". The lamp may be equivalent to a 40 W, 60 W, 75 W or 100 W bulb or it may be equivalent to other wattages.

The lamp of the invention may be embodied in different forms including standard and non-standard form factors. In other embodiments, the LED lamp can have any shape, including standard and non-standard shapes. In some embodiments, the LED lamp may be equivalent to standard watt incandescent light bulbs such as, but not limited to, 40 Watt, 60 Watt, 100 Watt or other wattages.

Lamp 100 may be used with an Edison base 102. A lamp base, such as the Edison base 102, functions as the electrical connector to connect the lamp 100 to an electrical socket or other power source. Depending on the embodiment, other base configurations are possible to make the electrical connection such as other standard bases or non-standard bases. The base 102 comprises an electrically conductive Edison screw 103 for connecting to an Edison socket and may comprise a housing 105 connected to the Edison screw 103. The Edison screw 103 may be connected to the housing 105 by adhesive, mechanical connector, welding, separate fasteners or the like. The housing 105 may be made of an electrically insulating material such as plastic. In some embodiments the housing 105 may comprise a thermally conductive material where heat may be dissipated from the lamp in part using the housing 105

The housing 105 and the Edison screw 103 define an internal cavity 107 for receiving the electronics 110 of the lamp including the power supply and/or drivers or a portion of the electronics for the lamp. The lamp electronics 110 are electrically coupled to the Edison screw 103 such that the electrical connection may be made from the Edison screw 103 to the lamp electronics 110. The lamp electronics may be mounted on a printed circuit board, which may be referred to herein as a "main" board, and which includes the power supply, including large capacitor and EMI components that are across the input AC line along with the driver circuitry as described herein. The base may be potted to protect and isolate the lamp electronics 110.

In some embodiments, a driver and/or power supply 110 are included in the base 102 as shown. Base 102 may include the power supply or driver and form all or a portion of the electrical path between the mains and the LEDs 127. The base 102 may also include only part of the power supply circuitry while some smaller components reside with the LED assembly 130. In one example embodiment, the inductors and capacitor that form part of the EMI filter are in the Edison base. Suitable power supplies and drivers are described in U.S. patent application Ser. No. 13/462,388 filed on May 2, 2012 and titled "Driver Circuits for Dimmable Solid State Lighting Apparatus" which is incorporated herein by reference in its entirety; U.S. patent application Ser. No. 12/775,842 filed on May 7, 2010 and titled "AC Driven Solid State Lighting Apparatus with LED String Including Switched Segments" which is incorporated herein by reference in its entirety; U.S. patent application Ser. No. 13/192,755 filed Jul. 28, 2011 titled "Solid State Lighting Apparatus and Methods of Using Integrated Driver Circuitry" which is incorporated herein by reference in its entirety; U.S. patent application Ser. No. 13/339,974 filed Dec. 29, 2011 titled "Solid-State Lighting Apparatus and Methods Using Parallel-Connected Segment Bypass Circuits" which is incorporated herein by reference in its entirety; U.S. patent application Ser. No. 13/235,103 filed Sep. 16, 2011 titled "Solid-State Lighting Apparatus and Methods Using Energy Storage" which is incorporated herein by reference in its entirety; U.S. patent application Ser. No. 13/360,145 filed Jan. 27, 2012 titled "Solid State Lighting Apparatus and Methods of Forming" which is incorporated herein by reference in its entirety; U.S. patent application Ser. No. 13/338,095 filed Dec. 27, 2011 titled "Solid-State Lighting Apparatus Including an Energy Storage Module for Applying Power to a Light Source Element During Low Power Intervals and Methods of Operating the Same" which is incorporated herein by reference in its entirety; U.S. patent application Ser. No. 13/338,076 filed Dec. 27, 2011 titled "Solid-State Lighting Apparatus Including Current Diversion Controlled by Lighting Device Bias States and Current Limiting Using a Passive Electrical Component" which is incorporated herein by reference in its entirety; and U.S. patent application Ser. No. 13/405,891 filed Feb. 27, 2012 titled "Solid-State Lighting Apparatus and Methods Using Energy Storage" which is incorporated herein by reference in its entirety.

The AC to DC conversion may be provided by a boost topology to minimize losses and therefore maximize conversion efficiency. The boost supply is connected to high voltage LEDs operating at greater than 200V. Examples of boost topologies are described in U.S. patent application Ser. No. 13/462,388, entitled "Driver Circuits for Dimmable Solid State Lighting Apparatus", filed on May 2, 2012 which is incorporated by reference herein in its entirety; and U.S. patent application Ser. No. 13/662,618, entitled "Driving Circuits for Solid-State Lighting Apparatus with High Voltage LED Components and Related Methods", filed on Oct. 29, 2012 which is incorporated by reference herein in its entirety. Other embodiments are possible using different driver configurations or a boost supply at lower voltages.

The term "electrical path" can be used to refer to the entire electrical path to the LED's 127, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LEDs. Electrical conductors run between the LEDs 127 and the lamp base 102 to carry both sides of the supply to provide critical current to the LEDs 127 as will be described.

Figure 3:
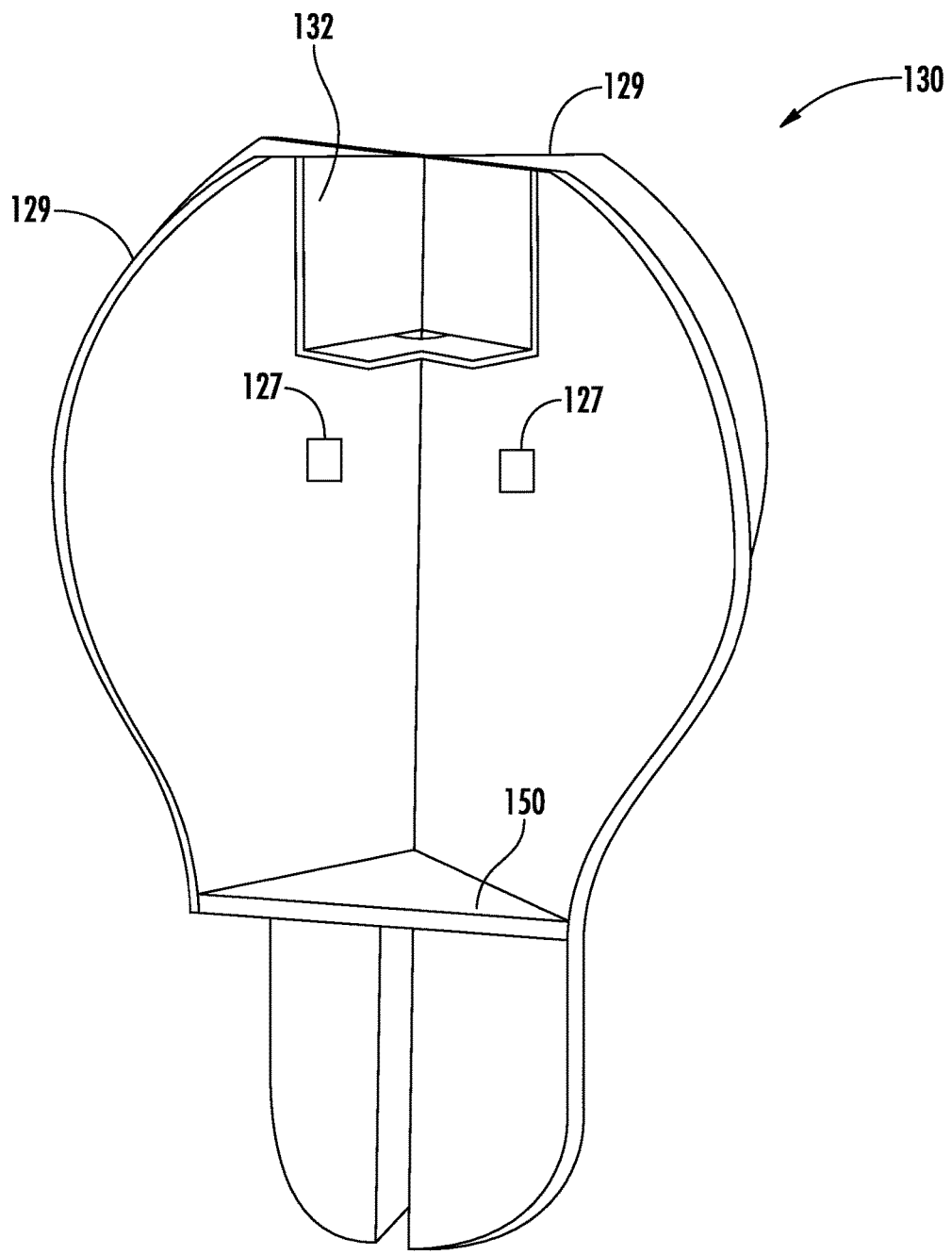
FIG. 3 is a schematic side view showing the arrangement of LEDs on the various circuit boards inside the lamp that is depicted in FIG. 1, which may also be referred to as the "LED assembly."

A schematic side view of LED assembly 130 is shown in FIG. 3. The LED assembly 130 may be contained in an optically transmissive enclosure 112 through which light emitted by the LEDs 127 is transmitted to the exterior of the lamp. The enclosure 112 may be entirely optically transmissive where the entire enclosure 112 defines the exit surface through which light is emitted from the lamp. In some embodiments, the exit surface of the enclosure may be coated on the inside with silica, providing a diffuse scattering layer that produces a more uniform far field pattern. The enclosure may also be etched, frosted or coated to provide the diffuser. In other embodiments the enclosure may be made of a material such as polycarbonate where the diffuser is created by the polycarbonate material. Alternatively, the surface treatment may be omitted and a clear enclosure may be provided. The enclosure may also be provided with a shatter proof or shatter resistant coating. It should also be noted that in this or any of the embodiments shown here, the optically transmissive enclosure or a portion of the optically transmissive enclosure could be coated or impregnated with phosphor or a diffuser.

In some embodiments the enclosure 112 may be provided with vent openings or apertures 108, 109 such that the interior of the lamp is in communication with the exterior of the lamp. The vent openings 108, 109 allow air to flow into, through and out of the enclosure 112 such that the air cools the LED assembly 130 inside of the enclosure. In one embodiment an aperture or apertures 108 are provided proximate to the base 102 and another aperture or apertures 109 are provided proximate to the distal end of the lamp such that air may flow through the enclosure 112 along the longitudinal axis of the lamp. In the example embodiment, a plurality of apertures 108 are provided that are formed as relatively narrow elongated slots. In some applications it is desirable to prevent a direct line of sight from a person to the light source 127. Using relatively narrow elongated slots may be used to prevent a direct line of sight to the LEDs 127. It will be understood that the LEDs 127 may be positioned in the enclosure 112 and the apertures 108 may be configured such that as the angle of observation through the slots 108 changes the dividers 108a between the slots 108 block direct line of sight view of the LEDs 127.

The LED assembly 130 may be implemented using a printed circuit board ("PCB") or other similar component which may be referred to as an LED board 129 and a plurality of LEDs 127. The lamp 100 is a solid-state lamp comprising a plurality of LEDs 127. Multiple LEDs 127 can be used together. The LEDs 127 can be mounted on or fixed within the lamp in various ways. The LEDs 127 in the LED array (plurality of LEDs that operate concurrently) include LEDs which may comprise an LED die or a plurality of LED dies disposed in an encapsulant such as silicone, and LEDs which may be encapsulated with a phosphor to provide local wavelength conversion. A wide variety of LEDs and combinations of LEDs may be used in the LED assembly 130 as described herein. The LEDs 127 of the LED array are operable to emit light when energized through the electrical path. While specific embodiments of LEDs are described herein, a greater or fewer number of LEDs may be used and the specific placement of the LEDs on LED boards 129 may vary from that shown.

LEDs 127 used with embodiments of the invention can include light emitting diode chips that emit hues of light that, when mixed, are perceived in combination as white light. Phosphors can be used as described to add yet other colors of light by wavelength conversion. For example, blue or violet LEDs can be used in the LED assembly of the lamp and the appropriate phosphor can be in any of the ways mentioned above. LED devices can be used with phosphorized coatings packaged locally with the LEDs or with a phosphor coating the LED die as previously described. For example, blue-shifted yellow (BSY) LED devices, which typically include a local phosphor, can be used with a red phosphor on or in the optically transmissive enclosure or inner envelope to create substantially white light, or combined with red emitting LED devices in the array to create substantially white light.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

In some embodiments, the LED boards 129 may comprise a PCB, such as FR4 board, a metal core printed circuit board (MCPCB), or other similar structure. The LED boards 129 comprise a thermally conductive material supported on a dielectric material or other electrically insulating material or materials. In the example embodiments shown in the figures, the LED boards effectively divide the interior space of the lamp into at least two sectors. If two boards are used and they intersect each other, there are four sectors. The thermally conductive area of a board may be formed as part of the electrical path connecting the LEDs 127 to the electronics 110 in the base 102. In some embodiments a large area of the LED board 129 may be thermally conductive such that a large area of the entire LED assembly 130 acts as a heat dissipative element to transfer heat to the air in the enclosure 112. It will be appreciated that in a typical PCB the electrical connections may be formed as metal traces or conductors where the traces or conductors are made relatively small so as to cover as small of an area of the PCB as possible and still provide electrical connections to the components on the PCB. In the lamp of the invention the LED board 129 may be provided with thermally conductive material such as copper, aluminum or the like where the amount of metal or other thermally conductive material used is sufficient to conduct heat away from the LEDs 127 and dissipate the heat to the surrounding air during steady state operation of the lamp. The copper, aluminum, other metal or other thermally conductive material on the LED boards 129 may form part of the electrical path to the LEDs 127. In some embodiments the electrically and thermally conductive material may form relatively small traces as is commonly done with PCBs but additional thermally conductive material may cover a relatively large area of the LED board as a component separate from the electrically conductive traces that form the electrical path to the LEDs if the LEDs require additional thermal dissipation. If the LEDs require additional thermal dissipation, additional metal may be used in the LED board for the electrical connections to the LED assembly or additional heatsinking may be used.

In an FR4 PCB the FR4 provides a glass epoxy insulating substrate. A layer of conductive material such as copper may be laminated to one, or both sides of the FR4 substrate. The FR4 copper-clad sheets comprise circuitry etched into copper layers to produce printed circuit boards. FR4 printed circuit boards may be produced in multiple layers. In some embodiments, the LED board 129 may comprise a MCPCB that comprises a thermally and electrically conductive core made of aluminum or other similar pliable metal material. The core is covered by a dielectric material such as polyimide. Metal core boards allow traces to be formed therein. Other structurally rigid structures for the LED board 129 may also be used. In embodiments using a LED board such as FR4 or MCPCB, the LED board has structural rigidity such that the board physically supports the LEDs 127 in position in the lamp and forms part of the electrical path to the LEDs 127. In the embodiment shown in FIGS. 2, 3, and 4, a support structure 132 supports the main LED boards and aids in keeping the LEDs fixed in place.

In some embodiments the LED board may comprise a hybrid structure where a rigid substrate physically supports the LEDs 127 in position in the lamp and where the electrical connections to the lamp may be made with a separate electrically conductive component. In some embodiments the electrical connections may be made using a flex circuit comprising a flexible layer of a dielectric material such as a plastic, polymeric, polyimide, polyester or other material to which a layer of copper or other electrically and thermally conductive material is applied such as by adhesive. Electrical traces are formed in the conductive layer of the electrically conductive material to form electrical pads for mounting the electrical components such as LEDs 127 and other lamp electronics 110 to the LED board and for creating the electrical path between the components. The conductive layer may be covered by a protective layer or layers. In other embodiments, a lead frame may be used to provide the electrical path to the LEDs 127 and may be made of an electrically conductive material such as copper, copper alloy, aluminum, steel, gold, silver, alloys of such metals, thermally conductive plastic or the like. Other electrical circuits may be used with the rigid substrate. The boards may be a single member or multiple members joined together. While in one embodiment the board may be a relatively thin planar member the board may have relatively wider or narrower portions.

Figure 4:
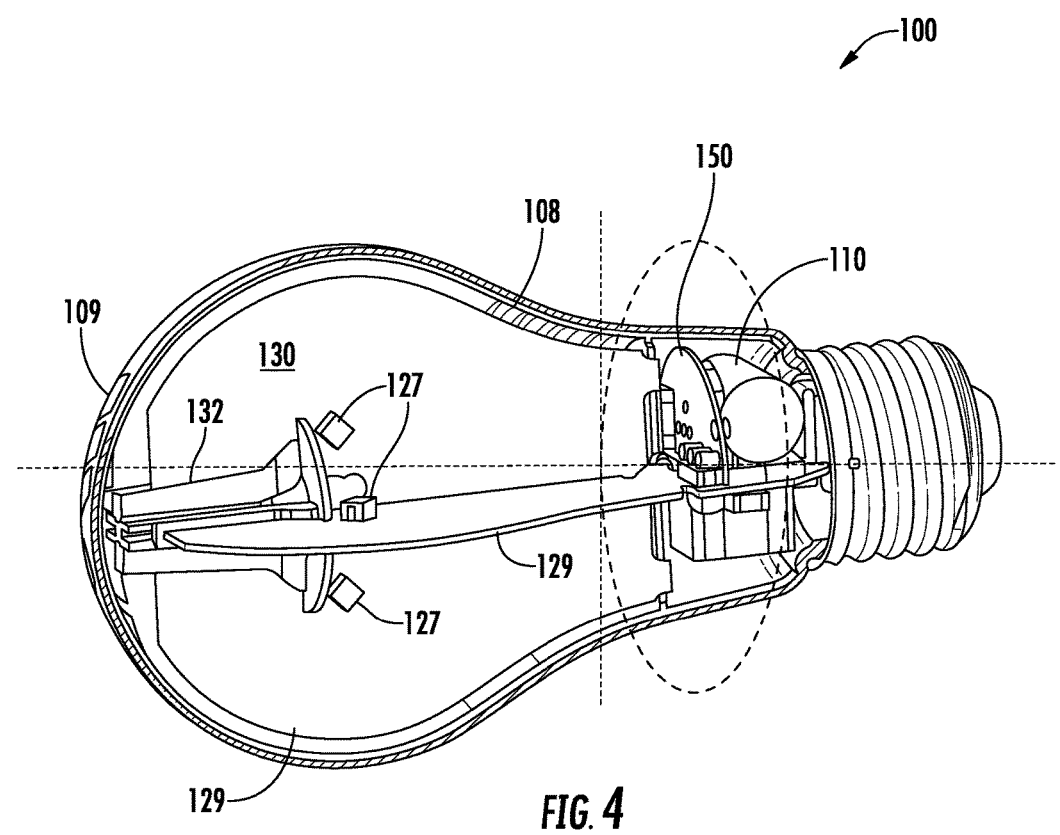
FIG. 4 is a cutaway view of the solid-state lamp of FIGS. 1 and 2, in which the lamp is pictured angled slightly so that more detail is visible in the figure.
Figure 5:
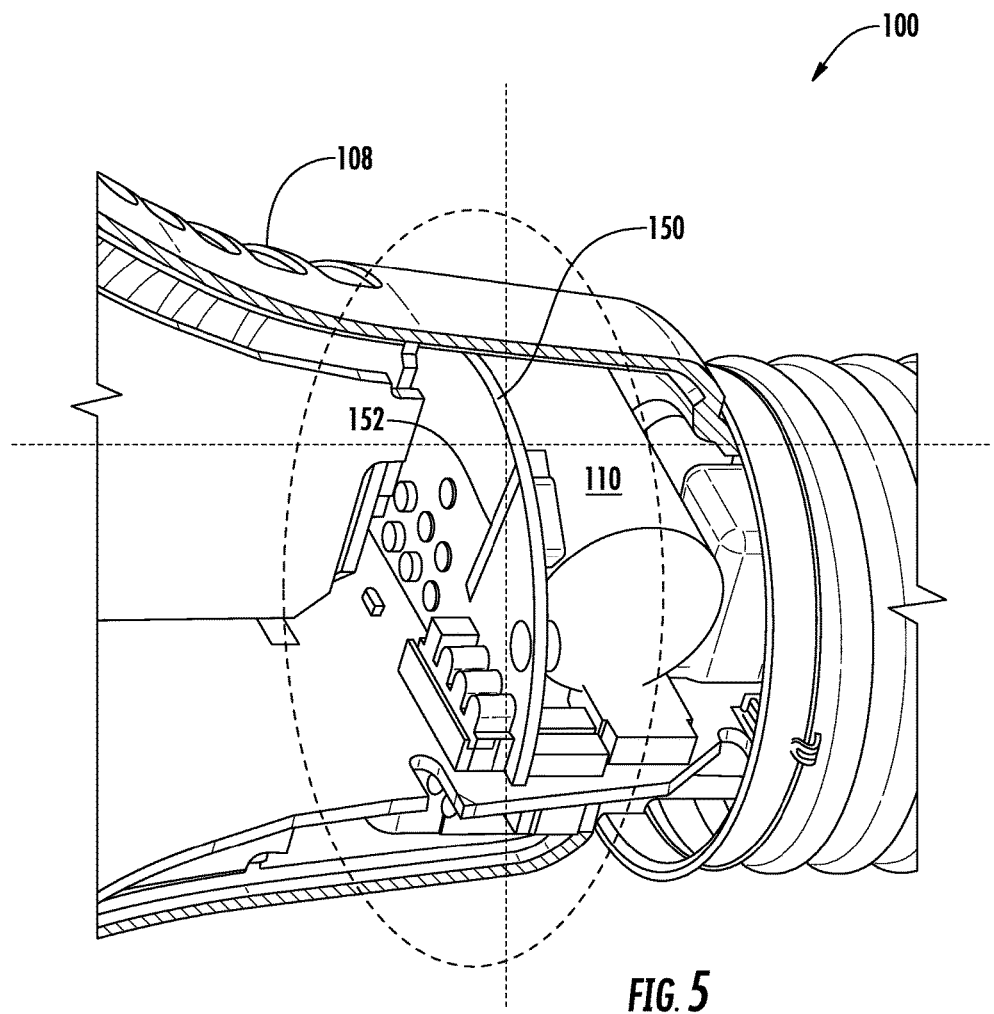
FIG. 5 is an enlarged close-up of a portion of the lamp as shown in FIG. 4.

Visible in the figures discussed above is RF daughter card 150, including antenna 152, which is visible in FIGS. 4 and 5. This antenna arrangement is different than currently available in SSL products, which typically integrate the antenna into or on the primary or main driver board or on a daughter board that is parallel to the main board. In such a configuration the antenna is forced to the edge or corner of the circuit board to optimize radiation efficiency and to provide sufficient clearance from the antenna to the circuit board ground layer or other circuitry which otherwise would detune the antenna and reduce performance.

Placing the antenna 152 so as to be nonparallel to the main circuit board or one of the main circuit boards in the lamp, for example, on daughter card 150, provides flexibility since the antenna can be located above the main driver and/or LED board and is not forced to an edge or corner. The added height provides distance from the main driver board circuitry. Additionally this architecture enables the design of an extremely small RF daughter card 150, which otherwise would not radiate effectively. One or more of the large conductors in the main circuit board can act as a counterpoise for the substantially perpendicular antenna. For example, the ground layer of the board could serve as the counterpoise. Soldering the daughter card to the main driver board increases the counterpoise area for the antenna and improves radiation efficiency. In this particular example, the non-parallel antenna is also substantially perpendicular to the main circuit board. By substantially perpendicular, what is meant in some embodiments is that the antenna is oriented within 10 degrees of perpendicular. In some embodiments, the substantially perpendicular antenna is oriented within five degrees of perpendicular. In some embodiments, the antenna must be close enough to 90 degrees to not lose more than 10% of the efficiency gained through the counterpoise if the antenna element were perfectly perpendicular.

As can be seen in the figures, other components may be located on the RF daughter card. The antenna may also be a chip antenna, implemented within a semiconductor or electronic package and mounted in the daughter card like other components. In this latter case, the physical antenna inside the package is oriented to be non-parallel to one or more of the main boards in the lamp as described above.

Figure 6:
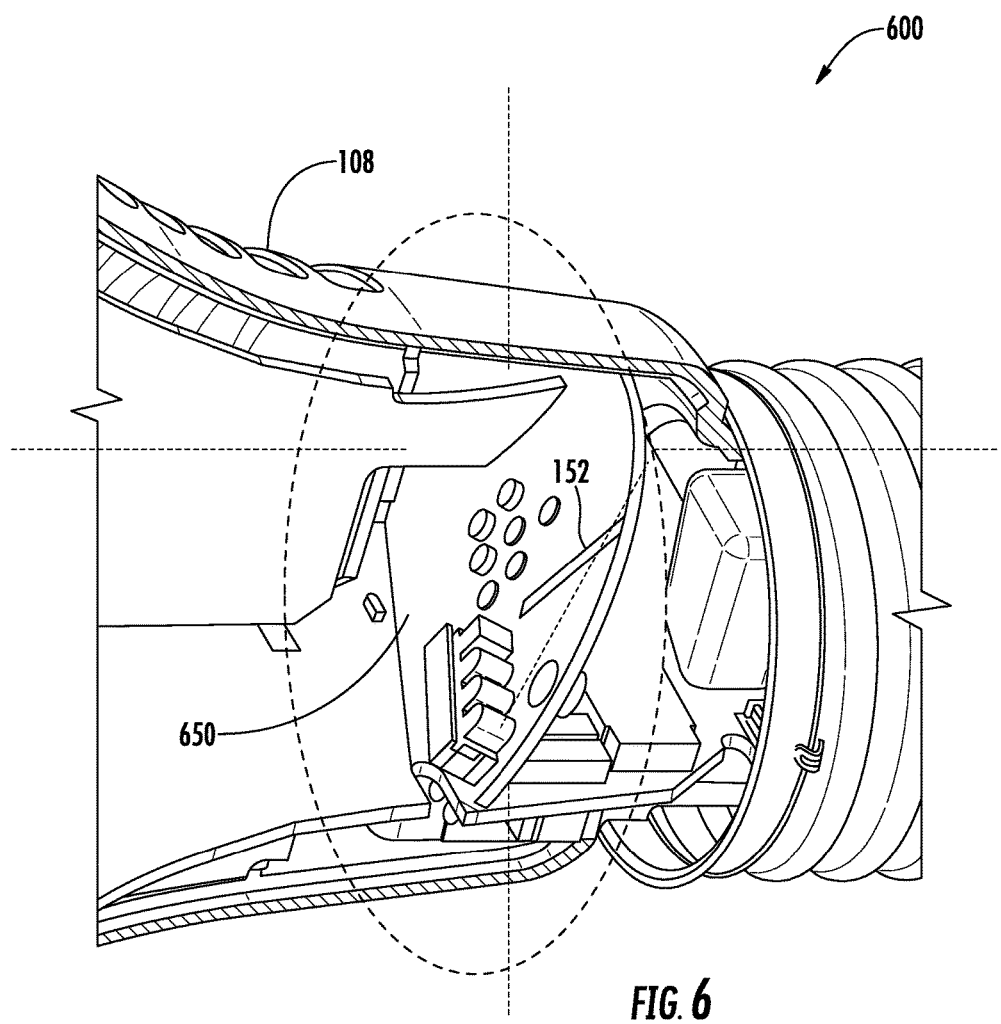
FIG. 6 is an enlarged close-up of a portion of a lamp according to additional embodiments of the invention.

FIG. 6 is a close-up cut-away view of a lamp 600 that is similar in many respects and uses many of the same components as the lamp of FIGS. 1, 2, 4, and 5. In this case, however, the RF daughter card, 650, is disposed at an angle that makes it non-parallel to the main board while not being substantially perpendicular to the main circuit board. The angle between RF daughter card and the main board in the case of FIG. 6 is about 50 degrees and the same angle is imparted to antenna 152. The antenna can be considered non-parallel to a circuit board in an interior cavity of the lamp if the angle between the antenna and the circuit board is anywhere from 5 degrees to 90 degrees. In some embodiments, this angle can be from 25 degrees to 90 degrees, in some embodiments the angle can be from 45 degrees to 90 degrees and in some embodiments, the angle can be from 75 degrees to 90 degrees. Note that if the antenna itself were angled on the RF daughter card, various angles can be imparted to the antenna while maintaining the RF daughter card in a fixed position, for example, a substantially 90 degree position as previously illustrated.

Figure 7:
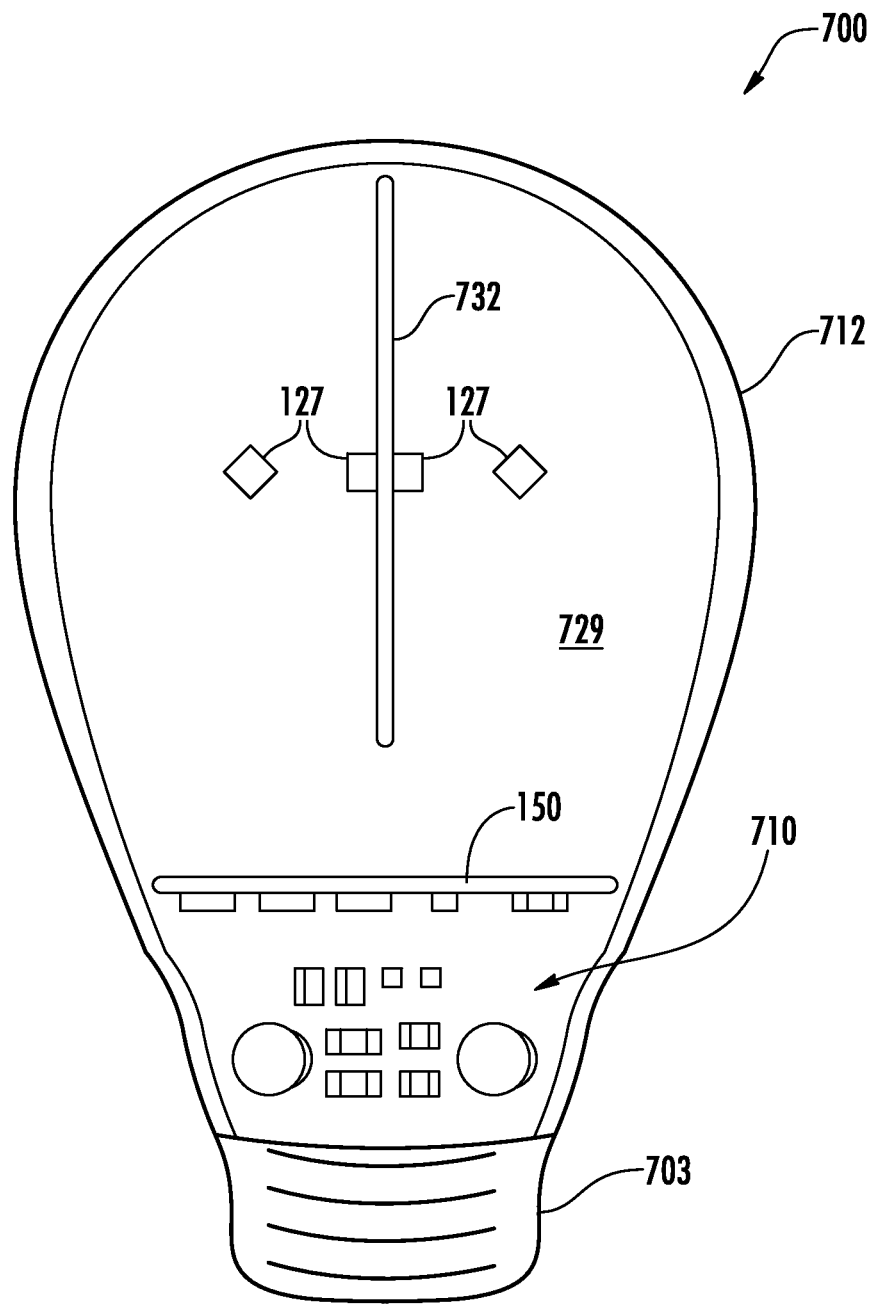
FIG. 7 is a cutaway view of a solid-state lamp according to further additional embodiments of the invention.

FIG. 7 is a cutaway view of an LED lamp 700 according to additional embodiments of the invention. Lamp 700 includes and Edison connector 703. The interior of lamp 700 includes one large board 729 that includes two of LEDs 127, and a smaller perpendicular LED board 732 that includes additional LEDs 127. Main board 729 also includes lamp electronics 710, which as previously described, may include power supply or driver components. Lamp 700 also includes RF daughter card 150 with a substantially perpendicular antenna as previously discussed. Lamp 700 has a large enclosure 712 that defines the interior cavity of the lamp where the LED array and other components reside. This large internal space allows the RF daughter card 150 to be spaced away from LED board 732 while still being close to main board 729, with the antenna perpendicular to main board 729.

Figure 8:
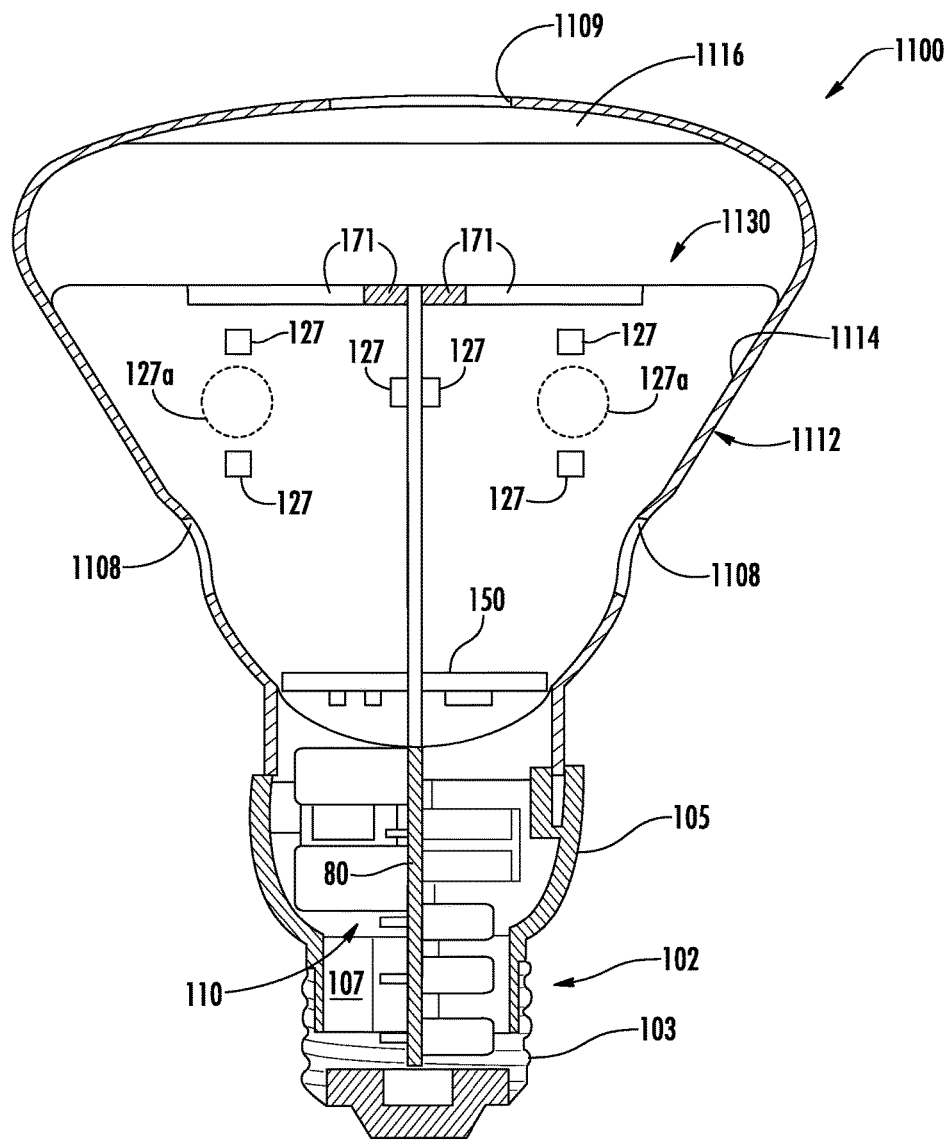
FIG. 8 is a cutaway view of a solid-state lamp according to further additional embodiments of the invention.

FIG. 8 shows a lamp 1100 according to some embodiments of the invention that may be dimensioned to be a replacement for a standard PAR incandescent bulb, such as a PAR-20, 30 or 38 bulb, or a BR-style lamp, such as a BR30. In some embodiments, the enclosure and base are dimensioned such that the dimensions of the lamp 1100 fall within the ANSI standards for a PAR or BR series bulb. Standard BR type bulbs are reflector bulbs where an internal reflective surface of the enclosure reflects light such that the light beam is emitted in a directional pattern; however, the beam angle is not tightly controlled and may be up to about 90-100 degrees or other fairly wide angles. Standard PAR bulbs are reflector bulbs that reflect light in a direction where the reflective surface is a parabola and the beam angle is tightly controlled. PAR lamps may direct the light in a pattern having a tightly controlled beam angle such as, but not limited to, 10°, 25° and 40°.

In the embodiment of FIG. 7 the enclosure 1112 of directional lamp 1100 may be partially optically transmissive where the enclosure comprises an optically transmissive exit surface 1116 and a reflector 1114 for reflecting light to the exit surface. The enclosure 1112 may be made of glass, quartz, borosilicate, silicate, polycarbonate, other plastic or other suitable material. The enclosure may be of similar shape to that commonly used in standard BR and/or PAR incandescent bulbs. In some embodiments, the exit surface of the enclosure may be coated on the inside with silica, providing a diffuse scattering layer that produces a more uniform far field pattern. The enclosure may also be etched, frosted or coated to provide the diffuser. In other embodiments the enclosure may be made of a material such as polycarbonate where the diffuser is created by the polycarbonate material. Alternatively, the surface treatment may be omitted and a clear enclosure may be provided. The enclosure may also be provided with a shatter proof or shatter resistant coating. It should also be noted that in this or any of the embodiments shown here, the optically transmissive enclosure or a portion of the optically transmissive enclosure could be coated or impregnated with phosphor or a diffuser.

The lamp 1100 of FIG. 8 includes a base 102 that may comprise an Edison connector 103 and a housing 105 as previously described. The enclosure 1112 may be connected to base 102. Enclosure 1112 may comprise an interior surface that defines reflector 1114 that reflects light in a desired pattern. The reflector 1114 may be a parabolic reflector such as found in a PAR style bulb for reflecting the light in a relatively tight pattern or the reflector 1114 may have other shapes such as conical or faceted for reflecting the light in a wider pattern such as may be found in a BR style bulb. The reflector 1114 may be formed as part of the enclosure 1112 or it may be formed as a separate component positioned inside of the enclosure. The reflector 1114 may be formed on the inside of the transparent plastic or glass enclosure and may be for example made of a reflective aluminum layer. The reflector 1114 may be an opaque plastic component made of reflective white material or it may be a specular surface located inside of the enclosure 1112. In a reflector lamp such as a PAR or BR style lamp the interior reflector reflects at least a portion of the light emitted by the LEDs 127 in the desired pattern out of exit surface 1116. Numerous configurations of both standard and nonstandard lamps may be provided. Other constructions of the reflective surface and enclosure are possible.

In the directional lamp 1100 of FIG. 8, the LED assembly 1130 is positioned in the enclosure 1112. The LEDs 127 and reflected light sources 127a direct some light directly out of the exit surface 1116 of the lamp. Translucent blockers 171 may be formed as part of the enclosure and or LED boards or may be added as inserts inside of the enclosure where the blockers 171 are positioned to block direct line of sight to the LEDs through the aperture 1109. Light that is not emitted directly out of the exit surface may be reflected by the reflector 1114 toward the exit surface 1116 such that the light is projected from the lamp 1100 in a desired directional beam. A secondary reflector may be provided to reflect light toward the exit surface 1116. Vents or apertures 1108 and 1109 may be provided to allow air flow through the enclosure and over the LED assembly 1130. Lamp 1100 also includes RF daughter card 150 with a substantially perpendicular antenna as previously discussed.

The various portions of a solid-state lamp or lighting system according to example embodiments of the invention can be made of any of various materials. Heatsinks can be made of metal or plastic, as can the various portions of the housings for the components of a lamp. A system according to embodiments of the invention can be assembled using varied fastening methods and mechanisms for interconnecting the various parts. For example, in some embodiments locking tabs and holes can be used. In some embodiments, combinations of fasteners such as tabs, latches or other suitable fastening arrangements and combinations of fasteners can be used which would not require adhesives or screws. In other embodiments, adhesives, screws, bolts, or other fasteners may be used to fasten together the various components.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A lamp comprising:
   a main circuit board comprising a ground layer, the main circuit board positioned in an interior cavity of the lamp and oriented in a first plane;
   at least one of an LED and a power supply component on or in the main circuit board;
   a separate radio frequency (RF) daughter card fastened to the main circuit board; and
   an antenna mounted to the RF daughter card, the antenna and the RF daughter card oriented in a second plane where the first plane is non-parallel to the second plane such that the antenna and the RF daughter card are positioned to be physically non-parallel to the main circuit board;
   the ground layer acting as a counterpoise for the antenna mounted to the RF daughter card.

2. The lamp of claim 1 wherein the antenna is substantially perpendicular to the main circuit board.

3. The lamp of claim 2 further comprising an Edison base.

4. The lamp of claim 3 dimensioned as a replacement for an A-series incandescent bulb.

5. The lamp of claim 3 dimensioned as a replacement for a BR or PAR type incandescent bulb.

6. The lamp of claim 1 further comprising an optical transmissive enclosure at least partially defining the interior cavity of the lamp.

7. The lamp of claim 1 wherein the main circuit board further comprises a plurality of main LED boards that divide the interior cavity of the lamp into at least two sectors, at least one of the main LED boards including at least one power supply component and at least one LED.

8. A lamp comprising:
   a base;
   an optically transmissive enclosure connected to the base;
   a plurality of LEDs disposed within the optically transmissive enclosure;
   a power supply within a void in the base, the power supply connected to the plurality of LEDs via an electrical path and comprising a main circuit board, the main circuit board oriented in a first plane;
   a ground layer within the main circuit board;
   a separate radio frequency (RF) daughter card fastened to the main circuit board; and
   an antenna mounted to the RF daughter card, the antenna and the RF daughter card oriented in a second plane where the first plane is non-parallel to the second plane such that the antenna and the RF daughter card are physically non-parallel to the main circuit board;
   wherein a ground layer within the main circuit board acts as a counterpoise for the antenna on the RF daughter card.

9. The lamp of claim 8 wherein the antenna is oriented to be substantially perpendicular to the main circuit board.

10. The lamp of claim 9 wherein the base comprises an Edison screw.

11. The lamp of claim 10 dimensioned as a replacement for an A-series incandescent bulb.

12. The lamp of claim 10 dimensioned as a replacement for a BR or PAR type incandescent bulb.

13. A method of controlling an LED lamp, the method comprising:
   energizing at least a portion of a power supply within the LED lamp, the power supply comprising a main circuit board, the main circuit board oriented in a first plane and including a ground layer within the main circuit board;

receiving a signal through an antenna mounted to a separate radio frequency (RF) daughter card, the RF daughter card fastened to the main circuit board, wherein the antenna and the RF daughter card are oriented within the lamp in a second plane where the first plane is non-parallel to the second plane such that the antenna and the RF daughter card are physically non-parallel to the main circuit board, and the ground layer within the main circuit board is electrically coupled to the RF daughter card and acts as a counterpoise for the antenna mounted to the RF daughter card; and selectively energizing at least one LED in accordance with the signal received through the antenna using the counterpoise.

14. The method of claim 13 wherein the antenna is oriented within the lamp to be substantially perpendicular to the main circuit board.

15. The method of claim 14 wherein the connecting of the lamp to the external power source is accomplished using an Edison screw.

16. The method of claim 15 wherein the LED lamp is dimensioned as a replacement for an A-series incandescent bulb.

17. The method of claim 15 wherein the LED lamp is dimensioned as a replacement for a BR or PAR type incandescent bulb.

* * * * *